United States Patent [19]
Leenders et al.

[11] Patent Number: 5,719,005
[45] Date of Patent: Feb. 17, 1998

[54] METHOD FOR THE FORMATION OF AN IMPROVED PHOTO MODE IMAGE

[75] Inventors: Luc Leenders; Eddie Daems, both of Herentals, Belgium

[73] Assignee: AGFA-Gevaert, N.V., Mortsel, Belgium

[21] Appl. No.: 571,306

[22] Filed: Dec. 12, 1995

[30] Foreign Application Priority Data

Dec. 27, 1994 [EP] European Pat. Off. ............. 94203763

[51] Int. Cl.$^6$ .............................. G03C 8/00; G03C 1/494
[52] U.S. Cl. ..................... 430/203; 430/233; 430/256; 430/272.1; 430/617; 430/465
[58] Field of Search ..................... 403/203, 204, 403/254, 255, 271.1, 965, 617, 272.1

[56] References Cited

U.S. PATENT DOCUMENTS

| | | | |
|---|---|---|---|
| 3,218,166 | 11/1965 | Reitter | 430/203 |
| 5,395,730 | 3/1995 | Podszun et al. | 430/203 |

*Primary Examiner*—Thorl Chea
*Attorney, Agent, or Firm*—Breiner & Breiner

[57] ABSTRACT

A method is disclosed for the the formation of a photo mode image based on a the introduction on exposure of a difference of tackiness in a photosensitive layer which contains a reducible silver salt such as silver behenate. After exposure the still tacky parts selectively take up a reactive toner containing a reducing agent. By means of a heat post-treatment density is built up by reduction of the organic silver salt. This density can be increased by the presence in the toner of a pigment, preferable carbon black. In this way high maximal densities can be obtained. In a preferred embodiment the difference in tackiness is introduced by image-wise photopolymerization of a monomer also present in the photosensitive layer.

17 Claims, No Drawings

METHOD FOR THE FORMATION OF AN IMPROVED PHOTO MODE IMAGE

DESCRIPTION

1. Field of the invention

The present invention relates to a method for the formation of an image based on an image-wise introduced differentiation in tackiness and using only dry processing steps.

2. Background of the invention

Conventional photographic materials based on silver halide are used for a large variety of applications. For instance, in the pre-press sector of graphic arts rather sensitive camera materials are used for obtaining screened images. Scan films are used for producing colour separations from multicolour originals. Phototype setting materials record the information fed to phototype- and image setters. Relative insensitive photographic materials serve as duplicating materials usually in a contact exposure process. Other fields include materials for medical recording, duplicating and hard copy, X-ray materials for non-destructive testing, black-and-white and colour materials for amateur- and professional still photography and materials for cinematographic recording and printing.

Silver halide materials have the advantage of high potential intrinsic sensitivity and excellent image quality. On the other hand they show the drawback of requiring several wet processing steps employing chemical ingredients which are suspect from an ecological point of view. As a consequence it is undesirable that depleted processing solutions would be discharged into the public sewerage; they have to be collected and destroyed by combustion, a cumbersome and expensive process.

In the past several proposals have been made for obtaining an image that can be formed using only dry development steps without the need of processing liquids as it is the case with silver halide photographic materials.

A dry imaging system known since quite a while is 3M's dry silver technology. It is a catalytic process which couples the light-capturing capability of silver halide to the image-forming capability of organic silver salts.

As a further alternative for conventional silver halide chemistry, dry imaging elements are known that can be image-wise exposed using an image-wise distribution of heat. These types of dry imaging elements called heat mode materials (or thermal imaging materials, thermal recording materials or thermographic materials) offer the advantage in addition to an ecological advantage that they do not need to be handled in a dark room nor any other protection from ambient light is needed. Heat mode recording materials, based on change of adhesion, are disclosed in e.g. U.S. Pat. No. 4,123,309, U.S. Pat. No. 4,123,578, U.S. Pat. No. 4,157,412, U.S. Pat. No. 4,547,456 and PCT applications WO 88/04237 and WO 93/03928.

In still another type of heat mode recording materials information is recorded by creating differences in reflection and/or transmission in the recording layer. The recording layer has high optical density. The conversion of radiation into heat brings about a local temperature rise, causing a change such as evaporation or ablation to take place in the recording layer. As a result, the irradiated parts of the recording layer are totally or partially removed, and a difference in optical density is formed between the irradiated parts and the unirradiated parts (cf. U.S. Pat. Nos. 4,216,501, 4,233,626, 4,188,214 and 4,291,119 and British Pat. No. 2,026,346). In a preferred embodiment the recording layer of such heat mode recording materials is made of a metal, e.g. bismuth.

Still another type of non-conventional materials as alternative for silver halide is constituted by so-called photo mode materials based on photopolymerisation. The use of photopolymerizable compositions for the production of images by information-wise exposure thereof to actinic radiation is known since quite a while. All these methods are based on the principle of introducing a differentiation in properties between the exposed and non-exposed parts of the photopolymerizable composition e.g. a difference in solubility, adhesion, conductivity, refractive index, tackiness, permeability, diffusibility of incorporated substances e.g. dyes etc.. The thus produced differences may be subsequently employed in a dry treatment step to produce a visible image and/or master for printing e.g. a lithographic or-electrostatic printing master.

The use of the difference in tackiness to obtain an image is described in e.g. U.S. Pat. No. 3,060,024, 3,085,488 and 3,649,268. According to the method disclosed in these U.S. patent applications the image-wise exposed photopolymerizable composition loses its tackiness in the exposed parts while the non-exposed parts keep their tackiness. The non-exposed parts can therefore be coloured with dry dye pigments to make the image visible. The commercially available colour proofing system CROMALIN, marketed by Du Pont Co, uses this technique. Further details can be found in U.S. Pat. No. 3,649,268, cited above, and in DE 2623925, U.S. Pat. No. 3,620,726, U.S. Pat. No. 3,607,264, U.S. Pat. No. 3,582,327, U.S. Pat. No. 3,615,435 and GB 1 417 088.

However such CROMALIN like systems show the disadvantage of a rather low obtainable maximal density which makes them unsuitable for use as contact films or recorder films in graphic arts pre-press, since such applications require a maximal density of at least 3.0 and preferably more (UV-density in transmission).

The present invention extends the teachings on imaging based on the introduction of a difference in tackiness by image-wise photopolymerization.

It is an object of the present invention to provide a method for the formation of a photo mode image with improved maximal density.

It is a further object of the present invention to provide a method for the formation of a photo mode image which is suitable as master for the exposure of a printing plate or an intermediate duplicating photographic material.

SUMMARY OF THE INVENTION

The objects of the present invention are realized by providing a method for the formation of a photo mode image comprising the following steps:

(1) exposing image-wise to actinic radiation a photosensitive element to produce image-wise tacky and complementary non-tacky areas, said photosensitive element comprising:

(a) a support, (b) a photosensitive layer or combination of layers containing a reducible organic silver salt and a polymeric binder, (2) applying a reactive toner containing a reducing agent to the surface of said exposed photosensitive element whereby said reactive toner adheres only to the tacky areas of said element, followed by removal of said toner from the non-tacky areas of said element, (3) subjecting said photosensitive element to an overall heat post-treatment thus forming a photo mode image in the tacky areas due to the reduction of said organic silver salt.

As a consequence of the thermal treatment the reactive toner particles fuse into the tacky image parts. Due to the thermally induced chemical reduction of the organic silver salt by the reducing agent, present in the toner, density is built up. In a preferred embodiment the reactive toner further contains a pigment, preferably carbon black. In this way high maximal densities can be obtained. The obtained image is suitable for serving as master for the exposure of a printing plate or intermediate duplicating material.

In a preferred embodiment the system is positive working, and in that case the photosensitive layer comprises preferably in just one layer a reducible organic silver salt, preferably silver behenate, and a photopolymerizable ethylenically unsaturated monomer, a photoinitiating system and a polymeric binder in such relative amounts that this layer is tacky in the unexposed areas and becomes non-tacky due to photopolymerization in the exposed areas. As a consequence a positive photo mode image is formed in the unexposed areas after completing the process. In this embodiment the photosensitive element preferably further comprises a protective foil (c) on top of it which is removed after exposure.

In an alternative embodiment the system is negative working, for instance, when the photosensitive layer contains an acetal and a photosensitizer which generates an acid on absorption of actinic radiation. The reaction products of the chemical reaction between the acid and the acetal render the layer tacky. In this case the reducible organic silver salt is preferably incorporated in a separate layer underlying the photosensitive layer in order to avoid chemical reactions between the acid and the reducible silver salt.

DETAILED DESCRIPTION OF THE INVENTION

The photosensitive layer(s) (b) of the present invention can contain positive as well as negative working systems.

First the particular features and ingredients of the photosensitive element for use in the preferred embodiment of the positive working version will now be explained in detail hereinafter. For such a positive working version photohardenable, particularly photopolymerizable systems are most suited. In this positive working version the photosensitive system and the reducible organic silver salt are preferably incorporated in just one layer (b).

Suitable transparent supports include e.g. cellulose nitrate film, cellulose acetate film, poly(vinyl acetal) film, polystyrene film, poly(ethylene terephthalate) film, polycarbonate film, polyvinylchloride film or poly-α-olefin films such as polyethylene or polypropylene film. The thickness of such organic resin film is preferably comprised between 0.025 and 0.20 mm. Suitable opaque supports include paper, e.g. resin coated paper.

In a most preferred embodiment the support is a polyethylene terephthalate support, preferably provide with a subbing layer. An example of a suitable subbing layer is a layer containing a polymer containing covalently bound chlorine. Suitable chlorine containing polymers are e.g. polyvinyl chloride, polyvinylidene chloride, a copolymer of vinylidene chloride, an acrylic ester and itaconic acid, a copolymer of vinyl chloride and vinylidene chloride, a copolymer of vinyl chloride and vinyl acetate, a copolymer of butylacrylate, vinyl acetate and vinyl chloride or vinylidene chloride, a copolymer of vinyl chloride, vinylidene chloride and itaconic acid, a copolymer of vinyl chloride, vinyl acetate and vinyl alcohol, chlorinated polyethylene, polychloroprene and copolymers thereof chlorosulfonated polyethylene, polychlorotrifluoroethylene, polymethyl-alpha-chloroacrylate etc. A preferred chlorine containing polymer is co(vinylidenechloride-methylacrylate-itaconic acid; 88% / 10% / 2%).

Suitable polymers not containing chlorine include co(styrene-butadiene-carbonic acid), polyvinyl acetate, and co(methylmethacrylate-butadiene-itaconic acid), In the latter case the amount of the itaconic acid part is preferably comprised between 2 and 15%. The $T_g$ of the polymer can be adjusted by varying the relative amounts of the methylmethacrylate and the butadiene parts while keeping the itaconic acid part constant at about 5%. In a most preferred embodiment the copolymer is composed of 47.5% of methylmethacrylate, 47.5% of butadiene and 5% of itaconic acid.

In the preferred positive working version of the present invention the essential ingredients of the photosensitive layer(s) are, apart from the reducible organic silver salt, a binder, a monomer, a photoinitiator and optionally a toning agent.

Examples of useful binders include organic solvent-soluble polymers, e.g. polymers derived from α,β-ethylenically unsaturated compounds such as e.g. polyvinyl acetate, a vinyl acetate-vinyl chloride copolymer, a styrene,-butadiene copolymer, polyethylene, and polypropylene. Other suitable binders for the photosensitive layer are styrene/maleic anhydride copolymers and their half esters, acrylic polymers and copolymers, polyamides, polyvinyl pyrrolidones, cellulose and its derivatives and phenolic resins. Especially preferred binders are polyvinyl acetals, such as polyvinyl butyral and polyvinyl propional. Still other preferred binders are polymethylmethacrylate, celluloseacetatebutyrate, and polyvinyl formals. The last mentioned are commercially available from Monsanto as FORMVAR. The formal content of the polyvinyl formals is approximately 65% to 86% expressed as percent polyvinyl formal. The acetate content is approximately 9% to 30% expressed as percent polyvinyl acetate. The hydroxyl content is approximately 5% to 7% as expressed as percent polyvinyl alcohol. The average molecular weight is between 10,000 and 40,000. When the binder is hard and has a high melting point then preferably plasticizers are added such as dialkylphthalates, ethyleneglycol or alkylphophates.

A wide variety of photopolymerisable, photohardenable and photocrosslinkable compounds can be used in the present invention. Suitable monomers include e.g. the monomers disclosed in DE-OS Nos. 4005231, 3516256, 3516257, 3632657 and U.S. Pat. No. 4,629,676, unsaturated esters of polyols, particularly such esters of the Alpha-methylene carboxylic acids, e.g. ethylene diacrylate, glycerol tri(meth)acrylate, ethylene dimethacrylate, 1,3-propanediol di(meth)acrylate 1,2,4-butanetriol tri(meth) acrylate, 1,4-cyclohexanediol di(meth)acrylate, 1,4-benzenediol di(meth)acrylate, pentaerythritol tetra(meth) acrylate, pentaerythritol triacrylate, dipentaerythritol pentacrylate, trimethylolpropane triacrylate (TMPTA), ethoxylated TMPTA, triethyleneglycoldimethacrylate (TEGDMA), trimethylolpropanetrimethacrylate (TMPTMA), 1,5-pentanediol di(meth)acrylate, the his acrylates and methacrylates of polyethylene glycols of molecular weight 200–500, and the like: unsaturated amides, particularly those of the alphamethylene carboxylic acids, and especially those of Alpha-Omega-diamines and oxygen-interrupted omega-diamines, such as methylene bisacrylamide, methylene bis-methacrylamide, 1,6-hexamethylene bis-acrylamide, diethylene triamine trismethacrylamide, bis(gamma-methacrylamidopropoxy) ethane, beta-methacrylamidoethyl methacrylate, N-(betahydroxyethyl)-beta-(methacrylamido)ethyl acrylate and N,N-bis(beta-methacrylolyoxyethyl)acrylamide, vinyl esters e.g. divinyl succinate, divinyl adipate, divinyl phthalate, divinyl butane-1,4-disulphonate; and unsaturated aldehydes, e.g. sorbaldehyde (hexadienal). The photopolymerizable composition may also comprise polymers and/or oligomers comprising 2 or more polymerizable functions e.g. acrylated epoxies, polyester acrylates, urethane acrylates etc.. It will be clear that these monomers and/or polymers and/or oligomers can be used in admixture.

It is also possible to use monofunctional (meth)acrylic acid esters as monomer provided they are not to volatile and do not spread an unwanted odor. Suitable compounds include n-octylacrylate, n-octylmethacrylate, decylacrylate, decylmethacrylate, stearylacrylate, stearylmethacrylate, cyclohexylacrylate, cyclohexylmethacrylate, phenylethylacrylate, phenylethylmethacrylate.

The most preferred polymerizable compounds comprise one or more (meth)acrylate functional groups.

Other classes of photopolymerizable compounds containing (a) (meth)acrylate group(s) are reactive multifunctional monomers disclosed in EP 0 502 562 and represented by general formula (I) or (II):

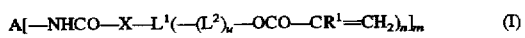  (I)

wherein n represents an integer from 1 to 3, m equals an integer of 3 to 6 when n equals 1, and 2 to 6 when n equals 2 or 3, and u equals 0 or 1;

A represents an organic group of the following nature being 3 to 6 valent when n equals 1 and being 2 to 6 valent when n equals 2 or 3:

a) a hydrocarbon residue containing 5 to 25 carbon atoms which may be interrupted by one or more ether, ester or amide functions;

b) 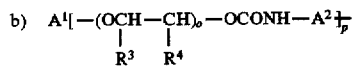

with A¹ representing a linear or branched aliphatic residue that may contain 0 to 3 O-atoms and 2 to 20 C-atoms, an aromatic residue containing 6 to 24 carbon atoms, an aromatic aliphatic residue containing 7 to 28 C-atoms or an cycloaliphatic residue containing 6 to 26 C-atoms, R³ and R⁴ each independently representing a hydrogen or a methyl group. A² representing a hydrocarbon residue containing 5 to 25 carbon atoms, o represents an integer of 0 to 5 and p represents an integer of 2 to 6 when n equals 2 or 3 and represents an integer of 3 to 6 when n equals 1;

c) 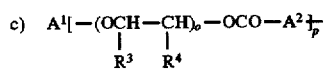

wherein A¹, A², R³, R⁴, o and p have the same meaning as defined above d) 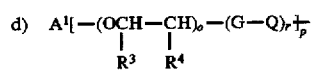

wherein A¹, A², R³, R⁴, o and p have the same meaning as defined above;

G represents —O—CO—NH—Y(—COO—)$_q$;

wherein Y represents a divalent (cyclo)aliphatic residue containing 2 to 15 C-atoms and that may contain an ester, ether or urethane function, and q represents 0 or 1

Q represents a linear or branched aliphatic hydrocarbon residue containing 3 to 15 carbon atoms and which may comprise 1 to 3 oxygen bridges and r equals 0 or 1.

X represents O or NR²,

L¹ represents an aliphatic hydrocarbon residue that is at least divalent and that may comprise 1 to 3 O-atoms.

L² represents a lower alkylene of 1 to 6 C-atoms which may be branched or linear, R¹ represents hydrogen or a methyl group, R² represents hydrogen or a lower alkyl group of 1 to 6 C-atoms;

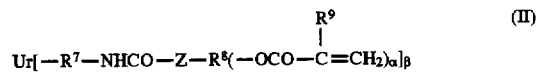  (II)

wherein

Ur represents a divalent or trivalent condensed urea residue;

Z represents O or NR¹⁰ with R¹⁰ representing alkyl containing 1 to 12 C-atoms;

R⁷ represents a divalent hydrocarbon residue containing 2 to 25 C-atoms;

R⁸ represents a hydrocarbon residue with a valence between 2 and 6, and containing 2 to 18 C-atoms, which can be linear or branched and which can be interrupted by up to 3 O atoms;

R⁹ represents hydrogen or methyl;

α represents an integer from 1 to 5, and

β equals 2 or 3.

Usable monomers comprise one of the following residues as hydrocarbon residue A and/or A² of general formula (I):

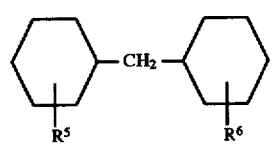 Ia

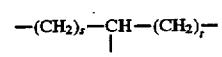 Ib

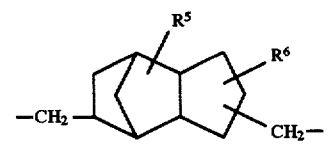 Ic

 Id wherein R⁵ and R⁶ each independently represent hydrogen or a lower alkyl of 1 to 6 C-atoms, s and t independently represent an integer from 1 to 6 and wherein the aliphatic hydrocarbon residues Ia, Ic and Id comprise 2 to 6 free valences.

Examples of monomers according to formula (I) suitable for use in accordance with the present invention are shown in table 1.

TABLE 1

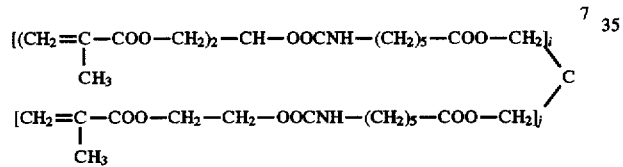

| | |
|---|---|
| CH₃—CH₂—C[CH₂O—(CH₂CH(CH₃)—O—)₂.₄—CO—(CH₂)₅—NHCOO—CH₂—CH₂—O—CO—C(CH₃)=CH₂]₃ | 1 |
| CH₃—CH₂—C[CH₂O—(CH₂CH(CH₃)—O—)₂.₄—CO—(CH₂)₅—NHCOO—CH—(CH₂—O—CO—C(CH₃)=CH₂)₂]₃ | 2 |
| C[CH₂O—CO—(CH₂)₅—NH—COO—CH₂—CH₂—OCO—CH=CH₂]₄ | 3 |
| C[CH₂O—CO—(CH₂)₅—NH—COO—CH₂—CH₂—OCO—C(CH₃)=CH₂]₄ | 4 |
| [(CH₂=C(CH₃)—COO—CH₂)₂—CH—OOCNH—(CH₂)₅—COO—CH₂]₂ \ C / [CH₂=C(CH₃)—COO—CH₂—CH₂—OOCNH—(CH₂)₅—COO—CH₂]₂ | 5 |
| [(CH₂=C(CH₃)—COO—CH₂)₂—CH—OOCNH—(CH₂)₅—COO—CH₂]ᵢ \ C / [CH₂=C(CH₃)—COO—CH₂—CH₂—OOCNH—(CH₂)₅—COO—CH₂]ⱼ | 6 | i and j are respectively 3.5 and 0.5 indicating that compound 6 is a mixture of compounds obtained by reacting i equivalents of glycerine-dimethacrylate and j equivalents of hydroxyethyl methacrylate as disclosed in DE 3,703,130.

i and j are respectively 2.5 and 1.5 indicating that compound 7 is a mixture of compounds obtained by reacting i equivalents of glycerine-dimethacrylate and j equivalents of hydroxyethyl methacrylate as disclosed in DE 3,703,130.

[(CH₂=C(CH₃)—COO—CH₂)₂—CH—OOCNH—(CH₂)₅—COO—CH₂]ᵢ \ C / [CH₂=C(CH₃)—COO—CH₂—CH₂—OOCNH—(CH₂)₅—COO—CH₂]ⱼ    7

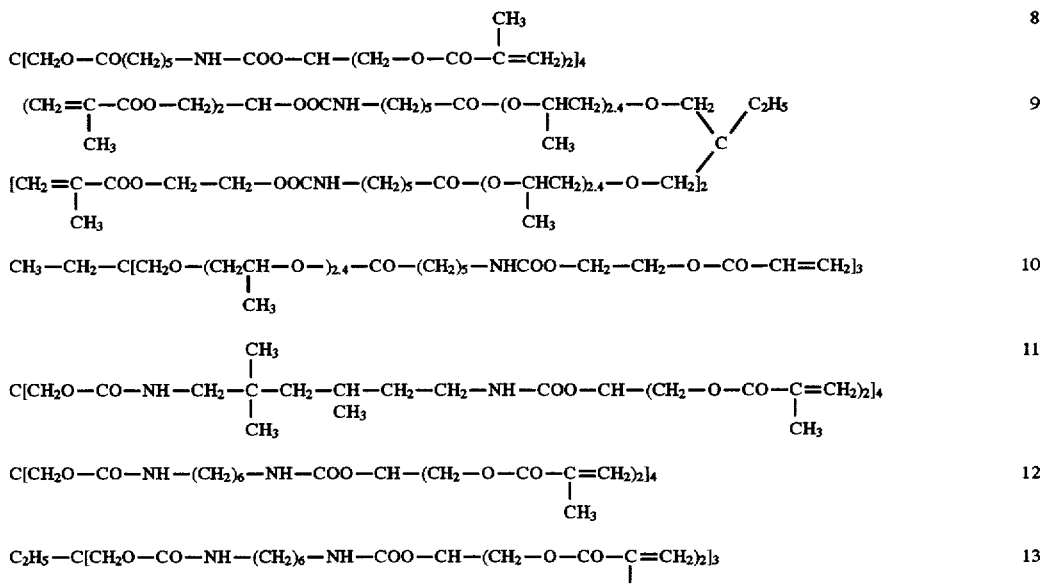

| | |
|---|---|
| C[CH₂O—CO(CH₂)₅—NH—COO—CH—(CH₂—O—CO—C(CH₃)=CH₂)₂]₄ | 8 |
| (CH₂=C(CH₃)—COO—CH₂)₂—CH—OOCNH—(CH₂)₅—CO—(O—CHCH₂)₂.₄—O—CH₂ \ C(C₂H₅) / [CH₂=C(CH₃)—COO—CH₂—CH₂—OOCNH—(CH₂)₅—CO—(O—CH(CH₃)CH₂)₂.₄—O—CH₂]₂ | 9 |
| CH₃—CH₂—C[CH₂O—(CH₂CH(CH₃)—O—)₂.₄—CO—(CH₂)₅—NHCOO—CH₂—CH₂—O—CO—CH=CH₂]₃ | 10 |
| C[CH₂O—CO—NH—CH₂—C(CH₃)(CH₃)—CH₂—CH—CH₂—CH₂—NH—COO—CH—(CH₂—O—CO—C(CH₃)=CH₂)₂]₄ | 11 |
| C[CH₂O—CO—NH—(CH₂)₆—NH—COO—CH—(CH₂—O—CO—C(CH₃)=CH₂)₂]₄ | 12 |
| C₂H₅—C[CH₂O—CO—NH—(CH₂)₆—NH—COO—CH—(CH₂—O—CO—C(CH₃)=CH₂)₂]₃ | 13 |

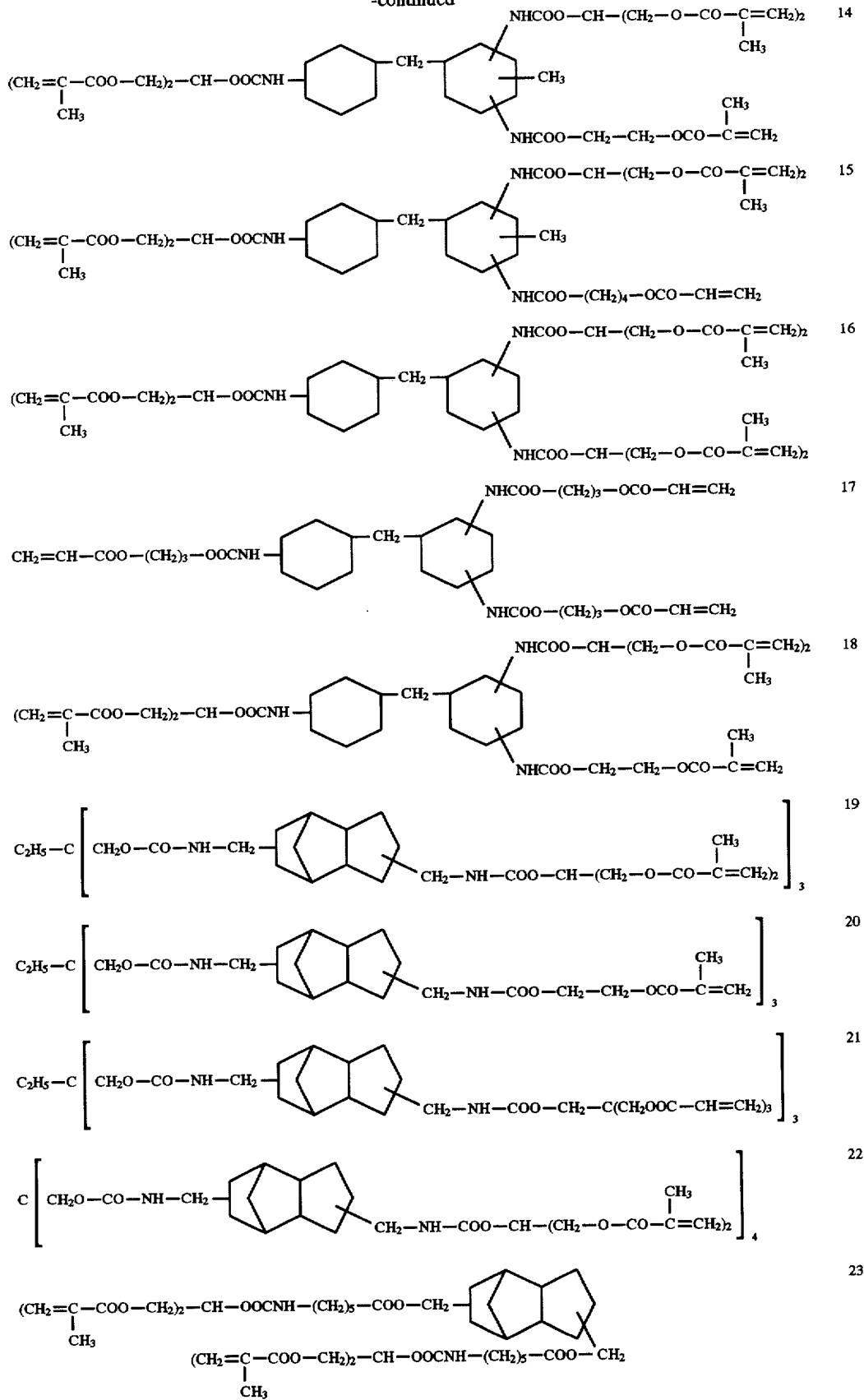

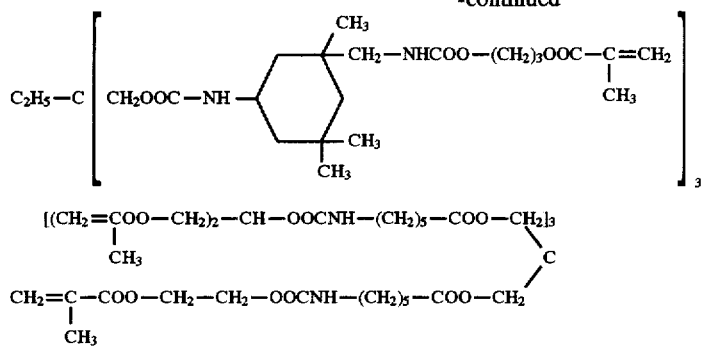

24

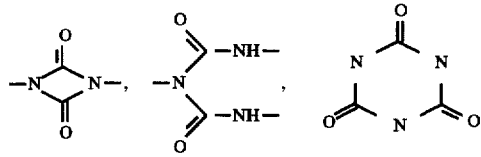

25

The fractal indexes in the formulas 1, 2 and 10 indicate that these formulas represent a mixture of compounds having a different length of the ethylene-oxide piece in said formulas the indexes thus representing an average of said ethylene-oxide piece. The formulas 14 to 23 represent a mixture of structural isomers and can be used in accordance with the present invention without separation of the isomers.

The monomers corresponding to general formula (I) are known and can be prepared according to the German patent application numbers 3,522,005, 3,703,080, 3,643,216, 3,703,130, 3,917,320 and 3,743,728.

In general monomer formula (II) preferred condensed urea residues represented by Ur are following structural units:

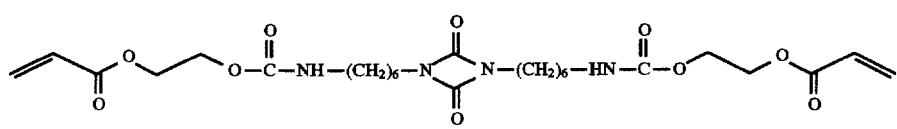

Examples of useful monomers according to general formula (II) are listed below in table 2:

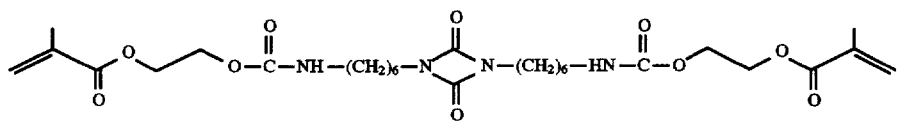

II-1

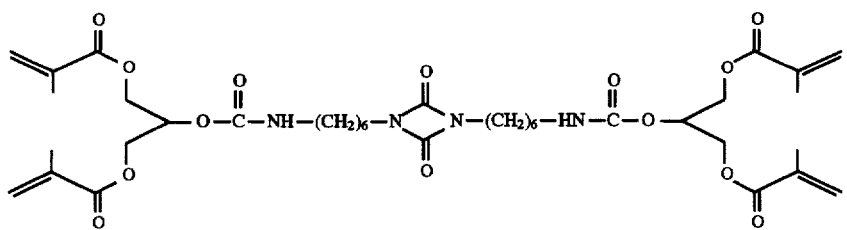

II-2

II-3

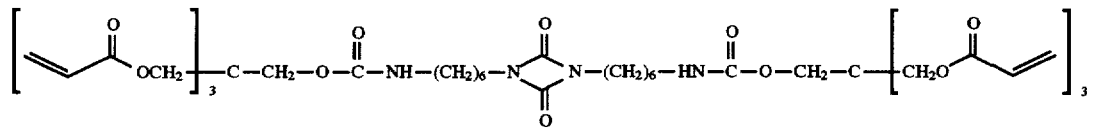

II-4

-continued

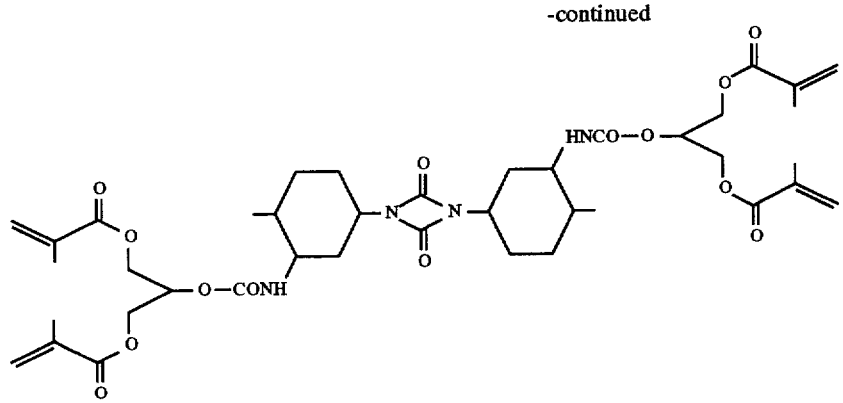
II-5

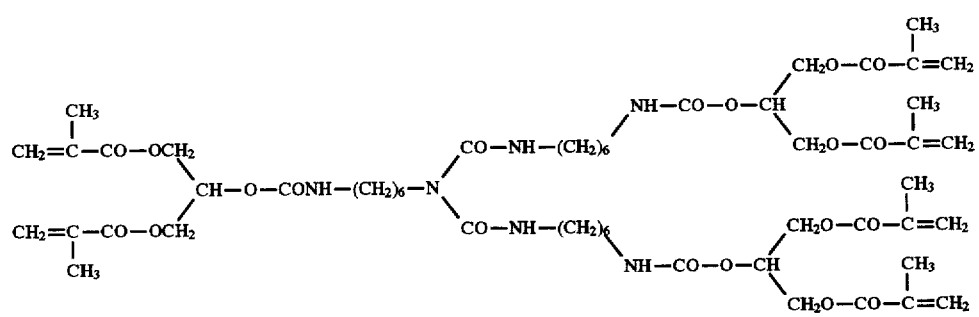
II-6

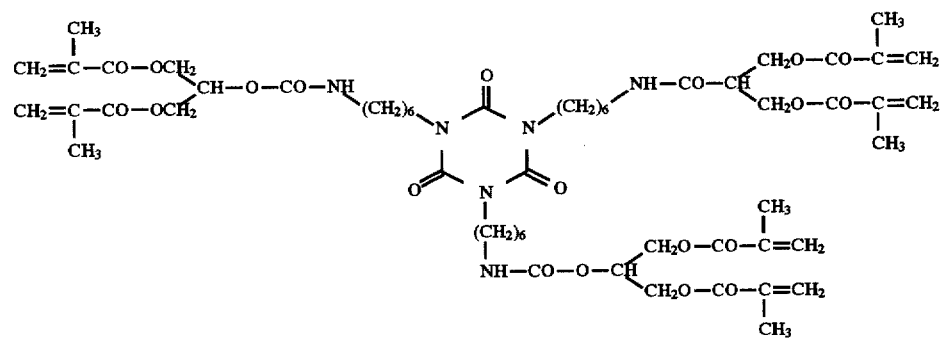
II-7

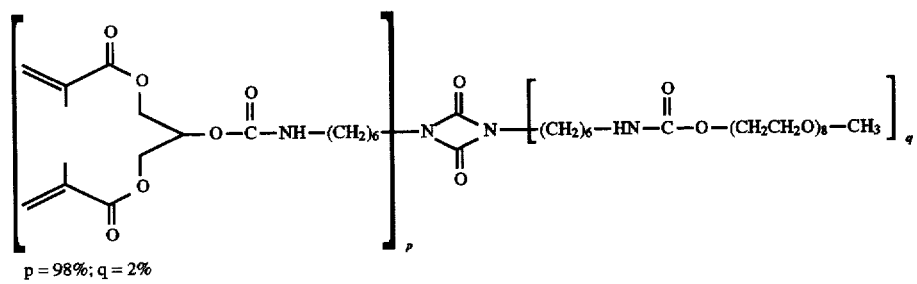
II-8 p = 98%; q = 2%

Most preferred monomers are trimethylolpropane triacrylate (TMPTA), ethoxylated TMPTA, triethyleneglycoldimethacrylate (TEGDMA) and trimethylolpropanetrimethacrylate (TMPTMA)

The photoinitiator system, present in the photosensitive layer, comprises one or more compounds which directly furnish free-radicals when activated by actinic radiation. It can also comprise a plurality of other compounds, e.g. spectral sensitizers, hydrogen donors.

Numerous conventional photoinitiators systems may be used provided they are compatible with the other ingredients of the element. Useful photoinitiators are ketoxime-esters.

Preferred photoinitiator systems are 2,4,5-triphenylimidazolyl dimers in combination with chain transfer agents, or hydrogen donors, such as are disclosed in U.S. Pat. No. 3,479,185, U.S. Pat. No. 3,784,557, U.S. Pat. No. 4,311,783 and U.S. Pat. No. 4,622,286. Preferred hexaarylbisimidazoles (HABI) are 2-o-chloro-substituted hexaphenylbisimidazoles in which the other positions on the phenyl radicals are unsubstituted or substituted with chloro, methyl or methoxy. The most preferred initiator is o.-Cl-HABI, i.e., 2,2'-bis-(o-chloro-phenyl)-4,4,5,5',tetraphenyl-1,1'-bisimidazole (or simply "bisimidazole") corresponding to following chemical formula

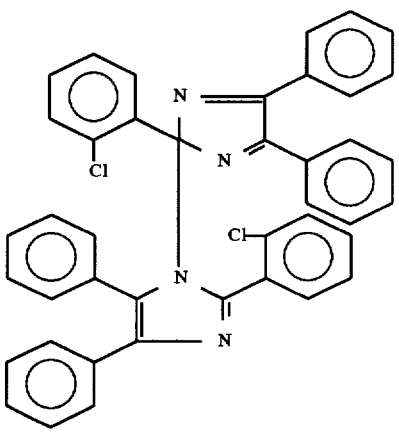

Hydrogen donor compounds useful as chain tranfer agents in the photopolymer layer include: 2-mercaptobenzoxazole, 2-mercaptobenzothiazole, 4-methyl-4H-1,2,4,-triazole-3-thiol, and the like. A preferred hydrogen donor is 2-mercaptobenzoxazole with following formula:

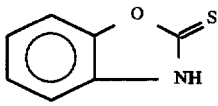

Although the HABI initiating systems described above are preferred, other initiating systems may be used in practicing this invention. Useful photoinitiators described in U.S. Pat. No. 2,760,863 include vicinal ketaldonyl alcohols, such as benzoin, pivaloin, acyloin ethers, e.g. benzoin methyl and ethyl ethers, and α-hydrocarbon-substituted aromatic acyloins, such as α-methylbenzoin. Further useful photoinitiators include quinoxaline compounds as described in U.S. Pat. No. 3,765,898, the vicinal polyketaldonyl compounds in U.S. Pat. No. 2,367,660, the α-carbonyls in U.S. Pat. No. 2,367,661 and 2,367,670, the acyloin ethers in U.S. Pat. No. 2,448,828, the triarylimidazolyl dimers in U.S. Pat. No. 3,479,185, the α-hydrocarbon substituted aromatic acyloins in U.S. Pat. No. 2,722,512, polynuclear quinones in U.S. Pat. Nos. 2,951,758 and 3,046,127, and s-triazines in U.S. Pat. No. 4,656,272.

The photoinitiator is preferably present in the photosensitive layer in an amount ranging from 2 to 30% by weight.

Many of the well known photoinitiator systems have limited applicability because they are activated only by UV radiation. For exposure in the visible region, e.g. by lasers, the use of so-called sensitizers is indispensable. A large number of free-radical generating systems have been used as sensitizers for the visible region for photopolymerizable compositions. U.S. Pat. No. 3,652,275 discloses selected bis(p-dialkylaminobenzylidene)ketones as sensitizers for HABI initiator systems. U.S. Pat. No. 4,162,162 discloses selected sensitizers derived from aryl ketones and p-dialkylaminoaldehydes. U.S. Pat. No. 4,987,230 and U.S. Pat. No. 4,987,230 also disclose sensitizers for HABI systems.

A preferred sensitizer is 7-diethylamino-4-methylcoumarin.

Substantially light-insensitive organic silver salts present in the photosensitive layer according to the present invention are silver salts of aliphatic carboxylic acids known as fatty acids, wherein the aliphatic carbon chain has preferably at least 12 C-atoms, e.g. silver laurate, silver palmitate, silver stearate, silver hydroxystearate, silver oleate and silver behenate. Silver salts of modified aliphatic carboxylic acids with thioether group as described e.g. in GB-P 1,111,492 and other organic silver salts as described in GB-P 1,439,478, e.g. silver benzoate and silver phthalazinone, may be used likewise. Further can be used silver salts of aromatic carboxylic acids (e.g. benzoic acid, phtalic acid, terephtalic acid, salicylic acid, m-nitrobenzoic-, phenylacetic-, pyromellitic-, p-phenylbenzoic-, camphoric-, huroic-, acetamidobenzoic- and o-aminobenzoic acid, etc.). Furtheron can be used silver salts of mercapto group- or thione group-containing compounds (e.g., 3-mercapto-4-phenyl-1, 2,-triazole, 2-mercaptobenzimidazole, etc.) or an imino group-containing compound (e.g. benzotriazole or derivatives thereof as described in GB 1,173,426 and U.S. Pat. No. 3,635,719, etc.). Further can be mentioned silver imidazolates and the substantially light-insensitive organic silver salt complexes described in U.S. Pat. No. 4,260,677.

In a most preferred embodiment of the present invention the organic silver salt is silver behenate. The compound is colourless, visibly stable toward light, insoluble in many volatile liquid vehicles, and moisture-resistant. It is producer in the desired physical form without difficulty and at reasonable cost.

In order to obtain a neutral black image tone in the higher densities and neutral grey in the lower densities the photosensitive layer can further contain a so-called toning agent known from thermography or photo-thermography. Suitable toning agents are the phthalimides and phthalazinones within the scope of the general formulae described in U.S. Pat. No. Re. 30,107. Further reference is made to the toning agents described in U.S. Pat. Nos. 3,074,809, 3,446,648 and 3,844,797. Other particularly useful toning agents are the heterocyclic toner compounds of the benzoxazine dione or naphthoxazine dione type within the scope of following general formula:

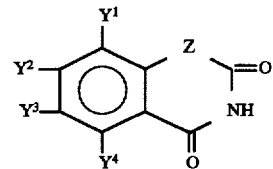

wherein

Z represents O or N-alkyl;

each of $y^1$, $y^2$, $y^3$ and $y^4$ (same or different) represents hydrogen, alkyl, e.g. $C_1$–$C_{20}$ alkyl, preferably $C_1$–$C_4$ alkyl, cycloalkyl, e.g. cyclopentyl or cyclohexyl, alkoxy, preferably methoxy or ethoxy, alkylthio with preferably up to 2 carbon atoms, hydroxy, dialkylamino of which the alkyl groups have preferably up to 2 carbon atoms or halogen, preferably chlorine or bromine; or $y^1$ and $y^2$ or $y^2$ and $y^3$ represent the ring members required to complete a fused aromatic ring, preferably a benzene ring, or $y^3$ and $y^4$ represent the ring members required to complete a fused-on aromatic or cyclohexane ring. Toners within the scope of said general formula are described in GB-P 1,439,478 and U.S. Pat. No. 3,951,660.

A particularly suited toning agent is 3,4-dihydro-2,4-dioxo-1,3,2H-benzoxazine described in U.S. Pat. No. 3,951,660.

The photopolymerizable element for use in the preferred embodiment of present invention is, since it is overall tacky before exposure, preferably protected before further treatment by means of a thin transparent polymeric foil. In a preferred embodiment a polyethylene terephthalate foil siliconised on one side and having a thickness between 12 and 50 μm is used. It is preferably applied with its silicone side to the photosensitive layer by lamination at room temperature. After exposure and before the treatment with reactive toner (see furtheron) the protective foil can easily be removed by peeling off.

The composition and preparation of the reactive toner for use in the present invention will now be explained in detail. The term "reactive" is employed since the toner contains a compound, i.c. a reducing agent, capable of reacting with another compound, i.c. the organic silver salt in the photosensitive layer.

The toner particles can essentially be of any nature as well with respect to their composition, shape, size, and preparation method and the sign of their tribo-electrically acquired charge, as long as said toner particles comprise at least a reducing agent.

The toner particles used in accordance with the present invention may comprise any conventional resin binder. The binder resins used for producing toner particles may be addition polymers e.g. polystyrene or homologues, styrene/ acrylic copolymers, styrene/methacrylate copolymers, styrene/acrylate/acrylonitile copolymers or mixtures thereof. Addition polymers suitable for the use as a binder resin in the production of toner particles are disclosed e.g. in BE 61.855/70, DE 2,352,604, DE 2,506,086, U.S. Pat. No. 3,740,334.

Also polycondensation polymers may be used in the production of toner particles used in accordance with the present invention. Polyesters prepared be reacting organic carboxylic acids (di- or tricarboxylic acids) with polyols (di- or triol) are the most prefered polycondensation polymers. The carboxylic acid may be e.g. maleic acid, fumaric acid, phthalic acid, isophthalic acid, terephthalic acid, trimellitic acid, etc or mixtures thereof. The polyolcomponent may be ethyleneglycol, diethylene glycol, polyethylene glycol, a bisphenol such as 2,2-bis(4-hydroxyphenyl)-propane called "bisphenol A" or an alkoxylated bisphenol, a trihydroxy alcohol, etc., or mixtures thereof. Polyesters suitable for use in the preparation of toner particles are disclosed in e.g. U.S. Pat. No. 3,590,000, U.S. Pat. No. 3,681,106, U.S. Pat. No. 4,525,445, U.S. Pat. No. 4,657,837, U.S. Pat. No. 5,153,301.

It is also possible to use a blend of addition polymers and polycondensation polymers in the preparation of toner particles as disclosed e.g. in U.S. Pat. No. 4,271,249.

Reducing agents suitable for incorporation in the reactive toner include pyrogallol, 4-azeloyl-bis-pyrogallol, 4-stearyl pyrogallol, galloacetophenone, di-tertiary-butyl pyrogallol, gallic acid anilide, methyl gallate, sodium gallate, ethyl gallate, normal- and iso-propyl gallate, butyl gallate, dodecyl gallate, gallic acid, ammonium gallate, ethyl protocatechuate, cetyl protocatechuate, 1-hydroxy-2-naphthoic acid, 2-hydroxy-3-naphthoic acid, phloroglucinol, catechol, 2,3-naphthalene diol, 4-lauroyl catechol, protocatechualdehyde, 4-methyl esculetin, 3,4-dihydroxy benzoic acid and its esters, 2,3-dihydroxy benzoic acid and its esters, dihydroxy-benzoic acid and its esters, hydroquinone, t.-butylhydroquinone, isopropylhydroquinone, 2-tetrazolylthiohydroquinonens, e.g., 2-methyl-5-(1-phenyl-5-tetrazolylthio)hydroquinone, 5-pyrazolones, 3-pyrazolones, 4,4'-dihydroxy-biphenyl, bis (2-hydroxy-3-t.-butyl-5-methylphenyl)methane, 2,2-bis(4-hydroxy-3-methylphenyl)propane, 4,4-ethylidene-bis(2-t.-butyl-6-methylphenol), 2,2-bis(3,5-dimethyl-4-hydroxyphenyl)propane, ascorbic acid and its derivatives, 3,4-dihydroxyphenylacetic acid, 4-(3',4'-dihydroxyphenylazo)benzoic acid, 2,2'-methylene-bis-3,4, 5-trihydroxybenzoic acid, ortho-, meta- and para-phenylenediamine, tetramethyl benzidine, 4,4',4"-diethylamino-triphenylmethane, o-, m-, and p-aminobenzoic acid, 4-methoxy-1-hydroxy-dihydronaphthalene and tetrahydroquinoline. Further useful reducing agents comprise aminocycloalkenone compounds, esters of amino reductones, N-hydroxyurea derivatives, hydrazones of aldehyde and ketones, phosphoramidophenols, phosphor amidoanilines, (2,5-dihydroxyphenyl)sulphone, tetrahydroquinoxalines, 1,2,3,4-tetrahydroquinoxaline, amidoximes, azines, hydroxamic acids, sulphonamidophenols, 2-phenylindane-1,3-dione, 1–4-dihydropyridines, such as 2,6-dimethoxy-3,5-dicarbethoxy-1,4-dihydropyridine. Still other useful reducing agents include resorcins, m-aminophenols, α- and β-naphtols, alkylphenols and alkoxynaphtols. A further class of reducing agents is constituted by hydrazine compounds. Especially preferred hydrazine compounds include p-tolylhydrazine hydrochloride, N,N-phenylformylhydrazide, acetohydrazide, benzoylhydrazide, p-toluenesulphonylhydrazide, N,N'-diacetylhydrazine, β-acetyl-phenylhydrazine, etc.

Another usable reducing agent is "Spirana", a spiro-bisindane derivative, disclosed in European patent Publ. No. 0 599 369, corresponding to following chemical formula:

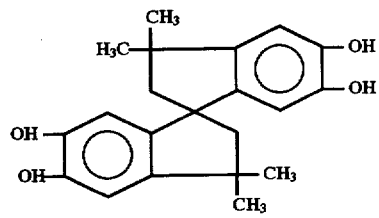

A most preferred reducing agent for the practice of this invention is ethyl gallate.

In an especially preferred embodiment of the present invention the toner particles also comprise one or more pigments to increase the achievable maximum density. As black pigment carbon black is preferred.

The toner particles may also comprise also toning agents, as described above, in order to obtain a neutral black image tone, as alternative to the presence of a toning agent in the photosensitive layer.

The toner particles may also comprise waxes or "heat solvents" also called "thermal solvents" or "thermosolvents" improving the penetration of the reducing agent(s) and thereby the reaction speed of the redox-reaction at elevated temperature.

By the term "heat solvent" in this invention is meant a non-hydrolyzable organic material which is in solid state at temperatures below 50° C. but becomes on heating above that temperature a plasticizer for the binder of the layer wherein they are incorporated and possibly act then also as a solvent for at least one of the redox-reactants, e.g. the reducing agent for the substantially light insensitive silver salt. Useful for that purpose is a polyethylene glycol having a mean molecular weight in the range of 1,500 to 20,000 described in U.S. Pat. No. 3,347,675. Further are mentioned compounds such as urea, methyl sulfonamide and ethylene carbonate being heat solvents described in U.S. Pat. No. 3,667,959, and compounds such as tetrahydro-thiophene-1, 1-dioxide, methyl anisate and 1,10-decanediol being described as heat solvents in Research Disclosure, Dec. 1976, (item 15027) pages 26–28. Still other examples of heat solvents have been described in U.S. Pat. Nos. 3,438, 776, and 4,740,446, and in published EP-A 0 119 615 and 0 122 512 and DE-A 3339810.

The toner particles used in accordance with the present invention may be prepared by mixing the above defined binder resin(s) and ingredients (the reducing agent and optionally an inorganic filler, etc) in the melt phase, e.g. using a kneader. The kneaded mass has preferably a temperature in the range of 90 to 140° C., and more preferably in the range of 105 to 120° C. After cooling the solidified mass is crushed, e.g. in a hammer mill and the obtained coarse particles further broken e.g. by a jet mill to obtain sufficiently small particles from which a desired fraction can be separated by sieving, wind classification, cyclone separation or other classifying technique. The actually used toner particles have preferably an average diameter between 3 and 20 µm on volume, more preferably between 5 and 10 µm when measured with a COULTER COUNTER (registered trade mark) MULTISIZER particle size analyzer operating according to the principles of electrolyt displacement in narrow aperture and marketed by COULTER ELECTRONICS Corp. Northwell Drive, Luton, Bedfordshire, LC 33, UK. In said apparatus particles suspended in an electrolyte (e.g. aqueous sodium chloride) are forced through a small aperture, across which an electric current path has been established. The particles passing one-by-one each displace electrolyte in the aperture producing a pulse equal the displaced volume of electrolyte. Thus particle volume response is the basis for said measurement.

Suitable milling and air classification may be obtained when employing a combination apparatus, such as the Alpine Fliessbeth-Gegenstrahlmühle (A.F.G.) type 100 as milling means and the Alpine Turboplex Windsichter (A.T.P.) type 50 G.C as air classification means, available from Alpine Process Technology, Ltd., Rivington Road, Whitehouse, Industrial Estate, Runcorn, Cheshire, UK. Another useful apparatus for said purpose is the Alpine Multiplex Zick-Zack Sichter also available from the last mentioned company.

The toner particles according to the present invention may also be prepared by a "polymer suspension" process. In this process the toner resin (polymer) is dissolved in a water immiscible solvent with low boiling point and the toner ingredients are dispersed in that solution. The resulting solution/dispersion is dispersed/suspended in an aqueous medium that contains a stabilizer. The organic solvent is evaporated and the resulting particles are dried. The evaporation of the solvent can proceed by increasing temperature, by vacuum evapoartion, by spray-drying as described in, e.g. U.S. Pat. No. 3,166,510, U.S. Pat. No. 3,338,991, electrostatic pulverizing as described in e.g. GB 2,121,203, etc. As suspension stabilizer it is possible to use e.g. silica particles, water soluble organic protective colloids (e.g. polyvinylalcohol), surface active agents, etc. In this procedure the temperature of the toner preparation can be lower than in the melt kneading toner preparation process.

In order to improve the flowability of the toner particles spacing particles may be added externally to said toner particles. Said spacing particles may be embedded in the surface of the toner particles or protruding therefrom or may be externally mixed with the toner particles, i.e. are used in admixture with the bulk of toner particles after the toner particles are produced. These flow improving additives are preferably extremely finely divided inorganic or organic materials the primary (i.e. non-clustered) particle size of which is less than 50 nm; essentially the same inorganic materials as those used in the preparation step of the toner particles are preferred, but the particles are preferentially hydrophobic. Silica particles that have been made hydrophobic by treatment with organic fluorine compounds for use in combination with toner particles are described in published EP-A 467439.

In preferred embodiments the proportions for fumed metal oxides such as silica ($SiO_2$) and alumina ($Al_2O_3$) to be admixed externally to the toner particles, prepared according to the present invention, are in the range of 0.1 to 10% by weight in respect to the toner particles.

Fumed silica particles are commercially available under the tradenames AEROSIL and CAB-O-Sil being trade names of Degussa, Franfurt/M Germany and Cabot Corp. Oxides Division, Boston, Mass., U.S.A. respectively. For example, AEROSIL R972 (tradename) is used which is a fumed hydrophobic silica having a specific surface area of 110 $m^2/g$. The specific surface area can be measured by a method described by Nelsen and Eggertsen in "Determination of Surface Area Adsorption measurements by continuous Flow Method", Analytical Chemistry, Vol. 30, No. 9 (1958) p. 1387–1390.

In addition to the fumed metal oxide, a metal soap e.g. zinc stearate, as described in GB-P 1,379,252, wherein also reference is made to the use of fluor containing polymer particles of sub-micron size as flow improving agents, may be present in the developer composition comprising the toner particles according to the present invention.

The actual process steps of the preferred positive working embodiment of the present invention will now be discussed.

The photosensitive element described above is imagewise exposed preferably through its coated side. When the element is only sensitive for the ultra-violet region it is exposed through an original pattern in a UV-contactapparatus. When it is sensitized to part of the visible region exposure in a scanner or image-setter equiped with a laser exposure source, e.g. an Ar ion laser, becomes possible.

After exposure the protective foil when present is removed by peeling off.

The treatment with the reactive toner explained above can be performed by gently rubbing the toner strewed egally over the surface of the photosensitive element. The toner adheres only to the unexposed still tacky parts. The photosensitive element is then subjected to an overall heat treatment whereby the toner fuses into the tacky parts. The heat treatment is performed by putting the element e.g. in an oven for about 10 seconds to about 5 minutes at about 70 to 110° C., or e.g. by pressing it to a heated plate or block or a pair of heated rollers.

In an alternative embodiment the reactive toner particles are incorporated in a so-called transfer toning layer coated on a temporary support. Development is achieved by laminating this toning film to the exposed photosensitive layer, containing image-wise tacky and non-tacky areas, followed by a peeling apart step whereby the reactive toner containing layer adheres only to the tacky areas. By a similar heat treatment as described above the toner fuses into the tacky parts.

Due to the high temperature treatment in either way of appplying the reactive toner chemical reduction of the organic silver salt to metallic silver takes place by the action of the reducing agent present in the reactive toner. In this way density is built up in the unexposed parts giving rise to a positive image. In the preferred embodiment wherein the toner further contains carbon black a density up to at least 3.0 or preferably more can be reached. In this case the system becomes suitable as alternative to the use of conventional silver halide contact films or recorder films (scan or image-setting films). The obtained photo mode image can then be used as master for the exposure of a printing plate or of an intermediate duplicating photographic material.

In an alternative embodiment of the present invention the system is negative working. Negative working tonable systems are described in e.g. German Patents 2758209, 3023247, 3429615 and 4228141. These systems contain as light-sensitive components either a light-sensitive dihydropyridine compound or a light-sensitive system consisting of a dihydropyridine compound and a hexaaryl-bis-imidazole compound. Other useful negative working tonable photoimaging systems are described in eg. U.S. Pat. No. 4,294,909 and U.S. Pat. No. 5,229,224. In an especially preferred embodiment of a negative working system, as will be illustrated by example 3 furtheron, the photosensitive layer contains as photosensitive components a photosensitizer which on absorption of actinic radiation generates an acid, and an acetal. Due to the reaction products of the chemical reaction between the acid and the acetal the layer is rendered tacky, so in this case in the exposed parts. In this embodiment the reducibe organic silver salt, preferably silver behenate, is preferably incorporated in a separate layer underlying the photosensitive layer containing the photosensitive components in order to avoid chemical reactions between the acid and the silver salt. Since the tonable parts are the tacky parts the reactive toner is able to diffuse through the photosensitive layer and reach the layer containing the reducible silver salt.

Since in this embodiment the photosensitive layer is overall non-tacky before exposure there is no need for the presence of a protective foil (c) as it was the case with the positive working preferred embodiment extensively described above.

The reactive toner can be applied in the same both ways as explained for the positive working version.

The present invention will now be illustrated by the following example without however being limited thereto.

EXAMPLES

Example 1

Preparation of the Photosensitive Element

A series of four coating solutions were prepared containing different amounts (see further table 1) of the following ingredients DIS 1=a 12% dispersion of silver behenate in a 6% solution of BUTVAR in methylethylketone (MEK);

extra methylethylketone;

compound A: a monomer (ethoxylated TMPTA) according to following formula:

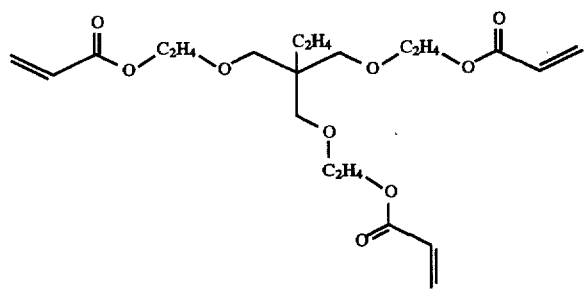

compound B: SARTOMER 351=monomer trimethylolpropanetriacrylate (TMPTA);

compound C: photoinitiator o.-Cl-HABI (see Description);

compound D: a spectral sensitizer according to following formula

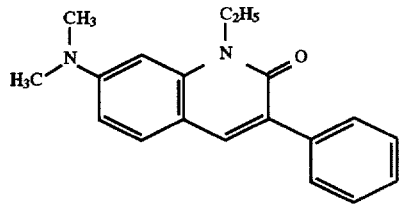

compound E: a hydrogen transfer agent (2-mercaptobenzoxazole) according to following formula:

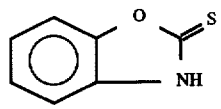

compound F: a toning agent according to following formula:

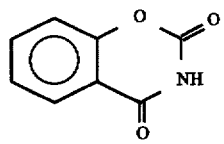

The coating composition of the different samples is summarized in table 1 (all amounts in gram):

TABLE 1

| Composition | Sample 1 | Sample 2 | Sample 3 | Sample 4 |
|---|---|---|---|---|
| DIS 1 | 15 | 15 | 15 | 22.5 |
| MEK | 32.4 | 27.4 | 23.4 | 23.4 |
| comp. A | 2.5 | 3.33 | — | 3.75 |
| comp. B | — | — | 2.5 | — |
| comp. C | 0.15 | 0.25 | 0.3 | 0.25 |
| comp. D | 0.03 | 0.04 | 0.03 | 0.04 |
| comp. E | 0.03 | 0.05 | 0.03 | 0.05 |
| comp. F | — | 0.13 | — | — |
| MEK | 32.4 | 27.4 | 23.4 | 23.4 |

These coating compositions were applied to a 100 μm thick polyethylene terephtalate support provided with a subbing layer containing co(vinylidenechloride-methylacrylate-itaconic acid), by means of a 100 μm BRAIVE coating knife. Subsequently the coated layers were dried for 3 minutes at 60° C.

A protective 23 μm thick polyethylene terephthalate foil, siliconised on one side, was laminated with its silicone side to the photosensitive layer in a CODOR LPP650 laminator (Dorned B. V.—The Netherlands) at room temperature and at a conveying speed of 60 cm/min.

Preparation of Toner Particles Comprising a Reducing Agent (toner A)

80 parts by weight of a linear polyester resin produced by the polycondensation of terephthalic acid, polyoxypropylene(2,3) 2,2 bis-4-hydroxyphenylpropane and ethylene glycol available under tradename DIACRON FC150 of Mitsubish Rayon, Japan, 10 parts by weight of $Al_2O_3$—C (ALUMINIUMOXIDE C, a tradename of Degussa AG, Frankfurt, Germany for hydrophilic alumina oxide with BET surface of 100 m²/g) and 10 parts by weight of ethylgallate were intimately mixed together, placed in a melt kneader and heated to 120° C. to form a smelt. This melt was melt kneaded for 20 minutes. Thereafter the mixture was allowed to cool to room temperature (20° C.). At that temperature the mass was crushed and classified to give toner particles with average particle size of 6.99 μm based on volume ($d_v$).

Preparation of Toner Particles Comprising a Reducing Agent and Carbon Black (toner B)

The preparation of toner B was similar to that of toner A with the exception that the 10% $Al_2O_3$ was replaced by 10% of carbon black (CABOT REGAL 400). An average particle size $d_v$ of 4.8 μm was obtained.

Exposure

The samples were image-wise exposed during 15 s (1.5× $10^4$ mJ/m².s) in a CDL1501 UV-contactexposure apparatus, marketed by Agfa-Gevaert N. V., through a photographic mask in contact with the thin protective foil.

Treatment With Reactive Toner

The photosensitive samples were treated with reactive toner A or B according to table 2 furtheron. The surface of the photosensitive element was egally dusted with the reactive toner. The toner adhered to the tacky unexposed non-photopolymerized parts of the photosensitive element.

Heat Post-Treatment

The samples treated with toner were subjected to an overall heat post-treatment in an oven at 110° C. for 1 min.

Results

Due to the heat treatment the reactive toner is fused into the tacky unexposed parts. By thermal reaction of reducing agent ethyl gallate comprised in the reactive toner particles with the silver behenate present in the photosensitive element the latter compound is reduced at least partially and density is built up. In this way a positive acting photo-mode image is formed. The obtained Dmax and Dmin values, measured by means of a MACKBETH TD904 densitometer equiped with a UV filter, are represented in following table 2.

TABLE 2

| sample | toner | before ΔT | | after ΔT | |
|---|---|---|---|---|---|
| | | Dmax | Dmin | Dmax | Dmin |
| 1 | B | 2.11 | 0.36 | 3.32 | 0.38 |
| 2 | A | 0.57 | 0.55 | 2.13 | 0.55 |
| 3 | A | 0.62 | 0.58 | 2.08 | 0.59 |
| 4 | A | 0.54 | 0.50 | 2.59 | 0.50 |
| 5 | B | 2.21 | 0.54 | 4.02 | 0.54 |

The table illustrates the considerable density increase obtained by the thermal post-treatment. When the reactive toner containing a reducing agent also contained carbon black densities of up to 4.0 could be reached which makes the method of the present invention suitable as alternative to the use of conventional silver halide recorder- or contact films. On inspection of the formed lines reproduced from the original test pattern it appeared that the maximal obtainable line resolution was about 15 à 20 μm.

Example 2

Preparation of the Photosensitive Element

The photosensitive element was identical to the one described in example 1.

Preparation of the Transfer Toning Layer

A mixture was prepared of 10 g of a 20% latex of copoly(2-ethylhexylacrylate-methylacrylate-mathacrylic acid; 68/30/2) (MW=10.000; MFT (minimal filmforming temperature) 0° C.), and 6 g of a 20% dispersion of ethyl protocatechuate containing 2% of the anionic surfactant Ultravon W (Ciba-Geigy). This mixture was added slowly whilst stirring to 55 g of a 20% latex of copoly (methylmethacrylate-methacrylic acid; 98/2) (MFT>95° C.). Water was added to make up a total volume of 100 ml.

This coating composition was coated on a 50 μm thick polypropylene film having a closed cell skin on both sides.

Lamination

The resulting transfer toning layer was laminated at 90° C. under pressure on top of the photosensitive element. The temporary propylene support was then removed thereby leaving the reactive toner layer on the unexposed parts only of the photosensitive element.

Heat Treatment

This step was identical to example 1.

Results

A positive image of good quality with a Dmax value of 3.1 and a background stain (Dmin) of about 0.55 was obtained. Dmax and Dmin values were measured with a Mackbeth densitometer equiped with a UV-filter.

Example 3

In this example a negative working embodiment of the present invention is illustrated.

Preparation of the Photosensitive Element (a) preparation of the photosensitive layer A coating solution was prepared containing following ingredients:

| | |
|---|---|
| polyvinylformal (FORMVAR 7/95E. Monsanto) | 1 g |
| 2-phenyl-1,3-dioxane | 0.6 g |
| polyacetal of formaldehyde and 1,5-pentanediol | 0.5 g |
| 2-tribromomethylquinoxaline | 0.2 g |
| triethyleneglycoltriacetate (1% in THF) | 0.006 ml |
| tetrahydrofuran | 47.7 g |

This coating composition was applied to a 23 μm thick polyethylene terephthalate support provided with a silicone layer by means of a 100 μm BRAIVE knife coater. The coated layer was dried for 3 minutes at 45° C.

(b) preparation of an image forming layer containing silver behenate

A solution was prepared consisting of:

| | |
|---|---|
| DIS 1 (see example 1) | 15 g |
| tricresyl phosphate | 0.9 g |
| MEK | 34.1 g |

This solution was coated onto a 100 μm thick polyethylene terephthalate temporary support, provided with a subbing layer (see ex. 1), by means of a 100 μm BRAIVE knife coater, and dried for 3 min at 60° C.

(c) lamination

The photosensitive layer was laminated to the image forming layer, both described above, in a CODOR LPP650 laminator (Dorned B. V.—The Netherlands) at 90° C.

Exposure

The thus prepared photosensitive element was imagewise exposed in contact for 3 minutes in a CDL1501 contactexposure apparatus (marketed by Agfa-Gevaert N. V.) through a photographic mask. Then the temporary support of the image forming layer was removed by peelingg off. The photosensitizer tribromomethylquinoxaline generates on absorption of actinic radiation the acid HBr which causes the decomposition of the acetal compound, as a result of which the FOMVAR binder is plasticized and the photosensitive layer becomes tacky.

The treatment with reactive toner and the heat post-treatment were the same as in example 1. Reactive toner B was used.

Results

A negative image of good quality with a background stain (Dmin) of 0.65 and a Dmax of 2.4 in the image parts was obtained.

We claim:

1. Method for the formation of a photo mode image comprising the following steps:
   (1) exposing image-wise to actinic radiation a photosensitive element to produce image-wise tacky and complementary non-tacky areas, said photosensitive element comprising:
      (a) a support,
      (b) a photosensitive layer or combination of photosensitive layers containing a reducible organic silver salt and a polymeric binder,
   (2) applying reactive toner particles comprising a resin binder and a reducing agent to the surface of said exposed photosensitive element whereby said reactive toner particles adheres only to the tacky areas of said element followed by removal of said reactive toner particles from the non-tacky areas of said element,
   (3) subjecting said photosensitive element to an overall heat post-treatment thus forming a photo mode image in the tacky areas due to the reduction of said organic silver salt.

2. Method according to claim 1 wherein said photosensitive layer or combination of photosensitive layers (b) further comprises a photopolymerizable ethylenically unsaturated monomer and a photoinitiating system, in such relative amounts that said photosensitive layer is tacky in the unexposed areas and becomes non-tacky in the exposed areas due to photopolymerization, so that after performing steps (2) and (3) a positive photo mode image is formed.

3. Method according to claim 2 wherein said photosensitive element further comprises a transparent protective foil (c) positioned over said photosensitive layer and which is removed before performing the further steps (2) and (3).

4. Method according to claim 3 wherein said protective foil (c) is a siliconized polyethylene terephthalate foil.

5. Method according to claim 1 wherein said photosensitive layer or combination of photosensitive layers (b) further comprise(s) an acetal and a photosensitizer, capable of generating an acid on exposure, whereby said photosensitive layer becomes tacky in the exposed areas due to chemical reactions, and remains non-tacky in the unexposed areas, so that after performing steps (2) and (3) a negative photo mode image is formed.

6. Method according to claim 5 wherein (b) is a combination of two layers, an upper one containing said photosensitizer and said acetal, and a lower one containing said reducible silver salt.

7. Method according to claim 1 wherein said reducing agent comprised in said reactive toner is ethyl gallate.

8. Method according to claim 1 wherein said reactive toner particles containing a reducing agent further contains a pigment.

9. Method according to claim 8 wherein said pigment is carbon black.

10. Method according to claim 1 wherein said reactive toner particles further contains a filling substance.

11. Method according to claim 10 wherein said filling substance is aluminum oxide.

12. Method according to claim 1 wherein said reducible organic silver salt in said photosensitive layer is silver behenate.

13. Method according to claim 1 wherein said photosensitive layer further contains a plasticizer.

14. Method according to claim 1 wherein said photosensitive layer further contains a toning agent.

15. Method according to claim 1 wherein said photosensitive layer further contains a spectral sensitizing compound.

16. Method according to claim 1 wherein said step (2) is performed by dusting said reactive toner particle homogeneously over the surface of said photosensitive layer.

17. Method according to claim 1 wherein said step (2) is performed by the following process steps: (i) coating a composition containing said reactive toner particles and a binder onto a temporary base, (ii) laminating this coated layer to said exposed photosensitive layer, and (iii) peeling off said temporary base, whereby said coated layer adheres only to the tacky parts.

* * * * *